United States Patent [19]

Adam

[11] Patent Number: 4,491,839
[45] Date of Patent: Jan. 1, 1985

[54] CMOS SELECTION CIRCUIT

[75] Inventor: Fritz G. Adam, Freiburg, Fed. Rep. of Germany

[73] Assignee: ITT Industries, Inc., New York, N.Y.

[21] Appl. No.: 373,818

[22] Filed: Apr. 30, 1982

[30] Foreign Application Priority Data

May 21, 1981 [DE] Fed. Rep. of Germany ....... 3120163

[51] Int. Cl.³ .............................................. H04Q 9/00
[52] U.S. Cl. .............................. 340/825.91; 307/243; 307/451
[58] Field of Search ................... 340/825.91; 307/243, 307/465, 449, 451, 463, 468, 471, 496, 583

[56] References Cited

U.S. PATENT DOCUMENTS

4,091,293  5/1978  Ando ................................... 307/451
4,424,460  1/1984  Best ..................................... 307/243

*Primary Examiner*—Donald J. Yusko
*Attorney, Agent, or Firm*—Donald J. Lenkszus

[57] ABSTRACT

In a circuit for selecting a random number (N) of potentials (Ui . . . ), which is integrated in accordance with the complementary insulated-gate field-effect transistor technique, one transmission gate (G . . . ) is associated with each potential, with the switching section of the gate lying between the potential (Ui . . . ) and the output (U), and the two control inputs of the respective transmission gate (G . . . ) are connected either directly or via a respectively associated inverter (I . . . ) to the corresponding output of a CMOS-1-ex-n-decoder. This decoder may consist of a 1-ex-n-open-circuit-decoder (SD) and of a 1-ex-n-short-circuit decoder (KD) whose address inputs are connected in pairs to one another and whose like outputs (1 . . . 8) are connected to one another. The open-circuit decoder (SD) consists of transistors (TP) of the one channel conductivity type, and the short-circuit decoder (KD) consists of transistors (TN) of the other channel conductivity type.

20 Claims, 6 Drawing Figures

FIG. 2
| A | L | L | L | L | L | L | L | L | H | H | H | H | H | H | H | H |
|---|---|---|---|---|---|---|---|---|---|---|---|---|---|---|---|---|
| B | L | L | L | L | H | H | H | H | L | L | L | L | H | H | H | H |
| C | L | L | H | H | L | L | H | H | L | L | H | H | L | L | H | H |
| D | L | H | L | H | L | H | L | H | L | H | L | H | L | H | L | H |
|   | 0 | 1 | 2 | 3 | 4 | 5 | 6 | 7 | 8 | 9 | 10| 11| 12| 13| 14| 15|
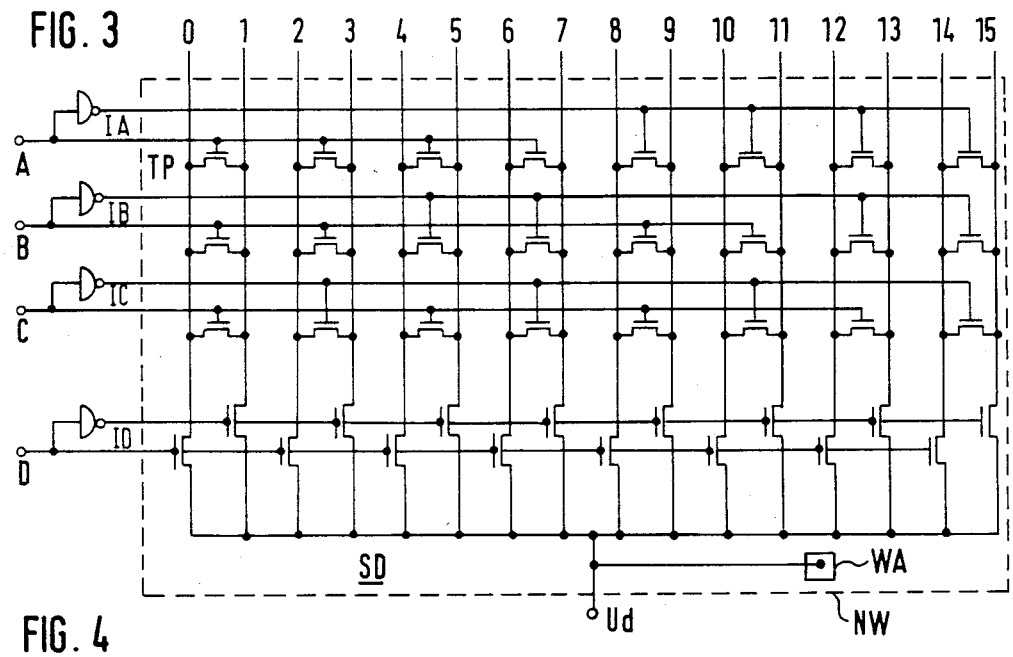
FIG. 3
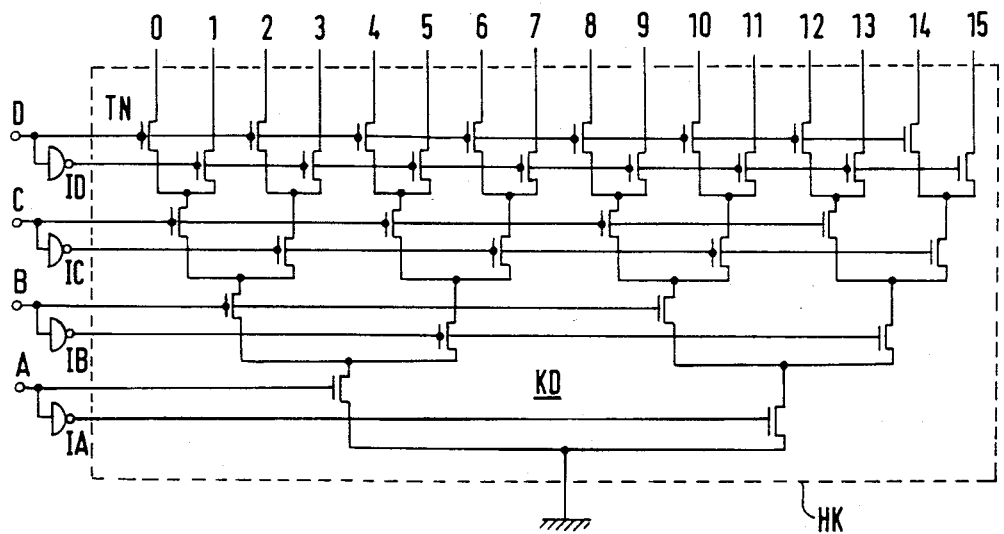
FIG. 4

4,491,839

CMOS SELECTION CIRCUIT

BACKGROUND OF THE INVENTION

The invention relates to an integrated selection circuit for a number N of potentials Ui . . . , which is integrated in a complementary insulated-gas field-effect transistor technique. Such types of selection circuits are disclosed, for example, in DE-OS No. 26 07 042, FIGS. 2 and 3. These selection circuits are designed for being controlled by a two- or three-bit binary signal and consist of the series arrangements of n-channel or p-channel transistors arranged in parallel with respect to the voltage output, with the number of transistors of the same channel conductivity type per series arrangement corresponding to the number of bits of the binary signal, and with the number of the series arrangements corresponding to the number of states of the binary signal. Thus, the aforementioned FIG. 2, shows an arrangement for a two-bit binary signal comprising accordingly $2^2=4$ series arrangements, and per series arrangement two n-channel or two p-channel transistors. The aforementioned FIG. 3 shows with respect to a three-bit binary signal, an arrangement including $2^3=8$ series arrangements and, per series arrangement three p-channel or three n-channel transistors.

The number N of potentials capable of being connected by the conventional arrangements, is identical to the number of states of the binary signal with half the number of potentials (N/2) which are within the negative half of the range of operating voltage, being connected to the series arrangements of n-channel transistors while the other (more positive) half is connected to the p-channel series arrangements. Accordingly, with the arrangement as shown in FIG. 2, a total of four potentials and, with the arrangement as shown in FIG. 3, a total of eight potentials can be connected through. The gates of the individual transistors are selected with the aid of the individual bits either directly or via interconnected inverters, with no mention being made, however, about the concrete realization thereof in terms of the employed circuit technique.

The prior art arrangements, however, have to pay for the advantages of a low power draw and a small number of transistors by the disadvantage of a higher output resistance of the respective through-connected potential. This higher output resistance results on account of the series arrangement of more than one transistor in cases where the channel widths of the transistors and, consequently, their surface requirement is not increased in proportion to the number of transistors per series arrangement. This measure, however, (and especially in the case of a large N) the advantage of the small number of transistors would be lost again.

SUMMARY OF THE INVENTION

It is the object of the invention as characterized in the claims, therefore, to provide a CMOS selection circuit which, also in the case of a large N, still safeguards a low output resistance by simultaneously maintaining a minimum power draw of the total circuit. The small power draw is achieved in that by using a CMOS-1-ex-n-decoder and, consequently, by completely designing the selection circuit in accordance with the CMOS technique, there only appears a very small quiescent current on account of inverse currents. The invention also has the advantage over the conventional arrangements disclosed in DE-OS No. 26 07 042, that the N potentials may be distributed arbitrarily throughout the operating voltage range 0 . . . Ud. Accordingly, the one half (N/2) of the potentials must not necessarily lie between 0 and Ud/2, and the other between Ud/2 and Ud, as with the DE-OS No. 26 07 042, but according to the principle of the invention, it is actually also possible, for example, to assign all N potentials to either the one or the other half of the total potential range.

The invention will now be explained in greater detail with reference to FIGS. 1 to 5 of the accompanying drawings, in which:

BRIEF DESCRIPTION OF THE DRAWINGS

FIG. 2 shows the assignment of states relating to a four-bit naturally binary encoded selecting signal, FIG. 3 shows the circuit diagram of a 1-ex-n-open-circuit decoder for the four-bit binary signal according to FIG. 2, FIG. 4 shows the circuit diagram of a 1-ex-n-short-circuit decoder for the four-bit binary signal according to FIG. 2.

DETAILED DESCRIPTION OF THE INVENTION

FIG. 1, partly in a schematical representation, shows the circuit diagram relating to one type of embodiment of the invention for a maximum of eight potentials U1 . . . U8 to be selected and which, in dependence upon the eight states 1 . . . 8 of the three-bit digital selecting signal A, B, C, are capable of being connected through to the output U. To each of the eight potentials U1 . . . U8 there is assigned one transmission gate G1 . . . G8 whose switching section is arranged between the respective potential and the voltage output U.

Figures 1A, 1B:
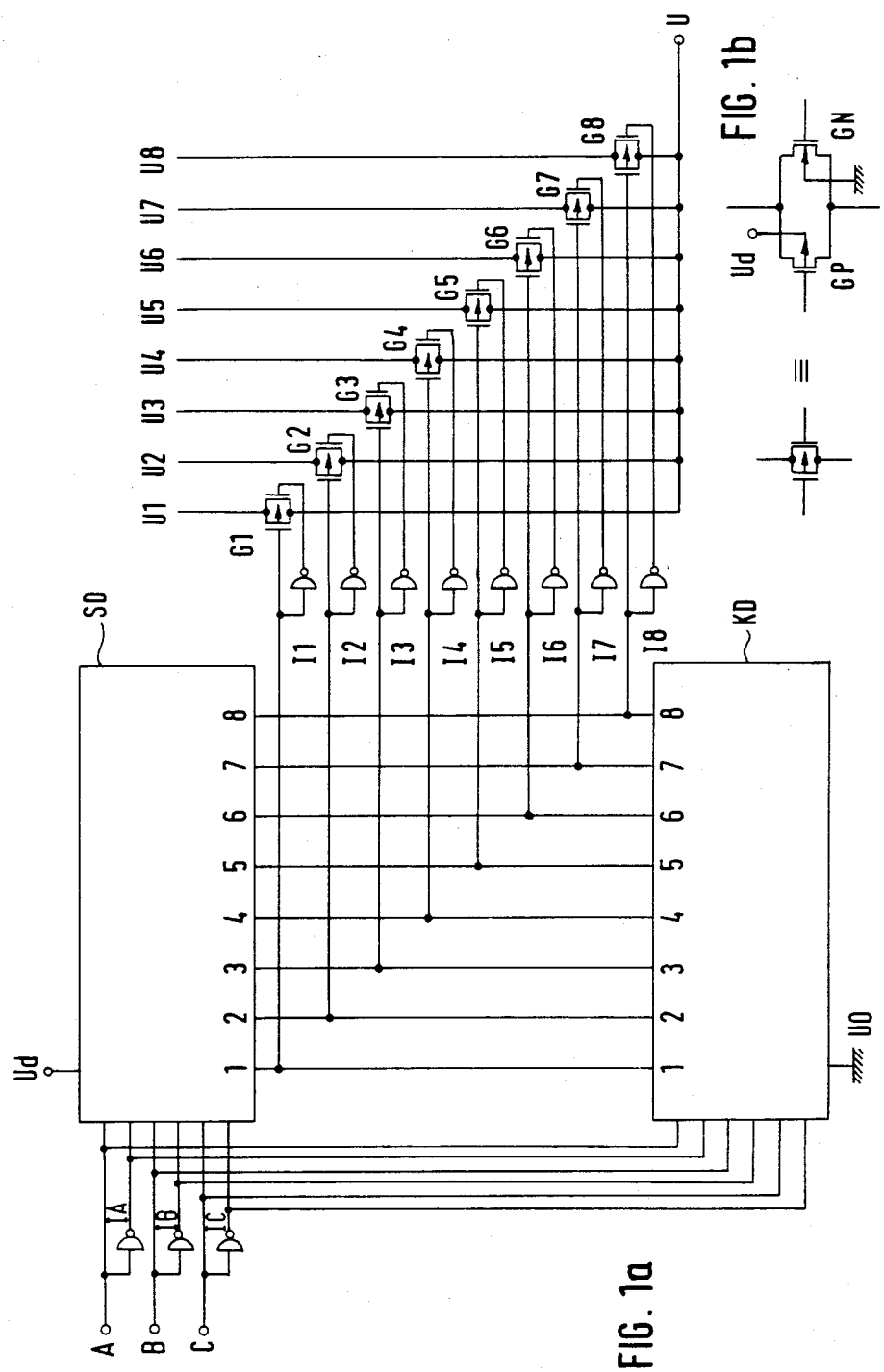
FIGS. 1a and b is a partly schematical representation, shows an example of embodiment of the invention relating to a maximum of eight potentials to be selected, in accordance with a three-bit selecting signal.

The respective control inputs of the transmission gates are selected either directly (in FIG. 1a these are the gates of the p-channel transistors) or else via the respective associated inverters I1 . . . I8 (in FIG. 1a these are the n-channel transistors), from the respective output 1 . . . 8 of the CMOS-1-ex-n-decoder. In the example of embodiment as shown in FIG. 1a, this decoder consists of two parts, i.e., of the 1-ex-n-open-circuit decoder SD and of the 1-ex-n-short-circuit-decoder KD, whose like outputs are connected to one another, and whose like address inputs are selected by the aforementioned selecting signal A, B, C in common either directly or via the associated preinverters IA, IB, IC. The open-circuit decoder SD consists of transistors of the one channel conductivity type which are arranged in an insulating island of the other channel conductivity type within the semiconductor body of the integrated selection circuit, which is connected to the operating voltage Ud. The short-circuit decoder KD consists of transistors of the other channel conductivity type, which are arranged within the semiconductor body.

In FIG. 1b it is shown more precisely how the two partial transistors of the transmission gates G1 . . . G8 are to be connected with respect to their substrates. Thus, the substrate of the p-channel partial transistor GP is to be connected to the operating voltage Ud, and that of the n-channel partial transistor GN is to be connected to the zero point of the circuit to which there is also connected the semiconductor body HK of the selection circuit. The Table of FIG. 2 shows the states of a four-bit naturally binary encoded digital signal as can be used for selecting the decoders as shown in FIGS. 3 and 4.

Thus, FIG. 3 shows the circuit diagram of an open circuit decoder SD capable of being selected by this four-bit selecting signal A . . . D, and which is exclusively composed of p-channel transistors TP. The functionally characteristic feature of this open-circuit decoder is to be seen in that all non-addressed decoder outputs are connected through to the operating voltage Ud while the line connections between the addressed output and Ud are interrupted. All p-channel transistors TP are arranged in the n-conducting insulating island NW of the semiconductor body which, in turn, is connected via the contact WA to the operating voltage Ud.

The circuit design of the open-circuit decoder SD according to FIG. 3 can be described in such a way that to the least-significant bit D of the selecting signal there is assigned each time one of the series transistors associated with the 16 outputs, and which are arranged between the operating voltage Ud and the corresponding output. These series transistors are selected alternatingly by the selecting bit signal D either directly or via the preinverter ID. The two outputs of such a pair of series transistors are then connected to one another via three shunt transistors each associated with the remaining three bits of the binary signal, and which in accordance with the showing of FIG. 3, are selected either directly or via the corresponding preinverter, by the corresponding selecting bit signal A, B, C.

FIG. 4 shows the circuit diagram relating to a corresponding short-circuit decoder KD which is composed exclusively of n-channel transistors TN which are arranged in the semiconductor body HK which is connected to the zero point of the circuit. The functionally characteristic feature of the short-circuit decoder KD is to be seen in that all connecting lines between the zero point of the circuit and the non-addressed decoder outputs are interrupted at least by one non-conducting transistor while the connecting line between the addressed output line and the zero point of the circuit is connected through by means of the series-arranged transistors. The design of the circuit can be described almost in such a way that, in starting out from the pair of transistors associated with the most-significant bit signal A and having the sources connected to the zero point of the circuit, the construction is branched in a tree-like manner into each time two branches extending towards the least-significant bit signals. Relative thereto, the two transistors having their sources connected together, are selected by the corresponding bit signal either directly or via the preinverter.

Thus, from the output-sided parallel arrangement of the two decoders as shown in FIGS. 3 and 4, there results with respect to each connecting line associated with one address, and extending between the zero point of the circuit and the operating voltage Ud, the behavior corrresponding to that of a simple CMOS inverter, i.e., in such a way that the respective addressed output will assume the potential of the short-circuit decoder substrate (in the drawings this is the potential of the zero point of the circuit), while all non-addressed outputs will assume the potential of the open-circuit decoder substrate (in the drawings this is the potential of the operating voltage Ud).

Figure 5:
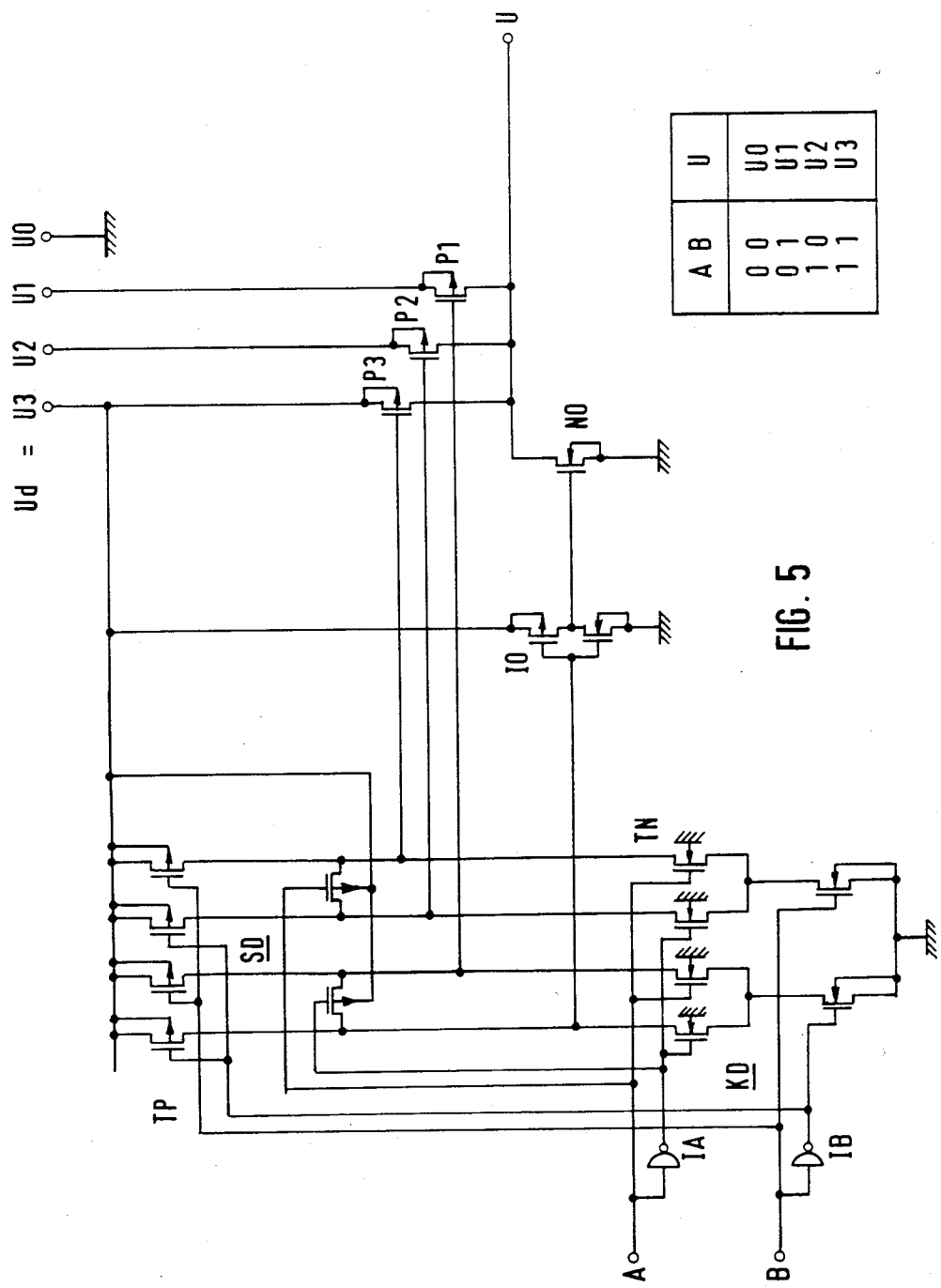
FIG. 5 shows the circuit diagram relating to a simplification of the invention for a maximum of four potentials to be selected.

FIG. 5 shows a simplification of the selection circuit according to the invention, i.e., for the sake of simplicity, relating to four potentials U0 . . . U3 to be selected, with the last-mentioned potential U3 being identical to the operating voltage Ud, and with the potential U0 being applied to the zero point of the circuit. The simplification resides in that with the transmission gates there are only provided the individual transistors of that particular channel conductivity type, by which the associated potential is connected through more rapidly and more low-ohmic to the voltage output U, and in that only those inverters are included which are actually required with a view to the channel conductivity type of the existing transistor. Accordingly, FIG. 5 shows the p-channel transistors P1, P2, P3 which are associated with the potentials U1, U2, U3, as well as the n-channel transistor N0 which is associated with the potential U0, and whose gate is selected by the CMOS inverter I0. The decoders SD, KD are 1-ex-4-decoders for the two-bit selecting signal A, B, with the substrate of the p-channel transistors TP of the open-circuit decoder SD being connected to the operating voltage Ud, and with the substrate of the n-channel transistors TN of the short-circuit decoder KD being connected to the zero point of the circuit. To the potential U0 at the voltage output U there is assigned the state 00 of the selecting signal A, B.

In this example as shown in FIG. 5, it is assumed that the potentials U1, U2 and U3 are all positive and greater than or in the utmost equal to $(Ud+U0)/2$.

To the invention in its simplified form, in which the transmission gates are replaced by individual transistors and in which the inverters inserted for the selection thereof, are omitted where possible, there apply quite generally (and somewhat more precisely) the following rules: To the potentials Uni which are to be connected through to the output U with the aid of individual transistors of the n-channel conductivity type, there applies $$U0 \leq Uni < U_{Gn} - U_{Tn}(Uni)$$

In this, $U_{Gn}$ indicates the control potential at the gate of the respective n-channel transistor and may, since it is obtained from a CMOS circuit, be made practically equal to the operating voltage $Ud>0$. Accordingly, the following applies:

$$U0 \leq Uni < Ud - U_{Tn}(Uni) \tag{1}$$

The expression $U_{Tn}(Uni)$ is to indicate that the threshold voltage of those transistors which are directly let into the semiconductor body as the substrate, is increased with respect to its normal value $U_{Tn0}$, i.e., by the so-called substrate effect $\Delta U_T(Uni)$ as resulting on account of the potential difference $(Uni-U0)$ between the source electrode and the substrate:

$$U_{Tn}(Uni) = U_{Tn0} = \Delta U_T(Uni)$$

with $$\Delta U_T = K(\sqrt{Uni - U0 + |2\phi_F|} - \sqrt{|2\phi_F|}).$$

In this equation, $\phi_F$ indicates the voltage corresponding to the energetic distance between the band-gap center and the Fermi-level of the substrate material. Accordingly, it is assumed that the CMOS circuit is realized by using n-insulating islands, i.e. that all n-channel transistors are let directly into a p-conducting semiconductor body as the substrate, and that p-channel transistors are to be accommodated in n-conducting insulating islands. The p-channel transistors which are to replace the transmission gates, are inserted according to the invention, into individual n-insulating islands in order thus to avoid the substrate effect. To the potentials Upi to be switched by the p-channel transistors, there then applies the condition $Ud \geq Upi > U_{GP} + |U_{Tpo}|$.

Since again the control potential $U_{Gp}$ is obtained from a CMOS circuit, $U_{Gp}$ is practically identical to the potential of the zero point of the circuit U0, and accordingly, the following applies:

$$Ud \geq Upi > U0 + |U_{Tpo}|. \quad (2)$$

When replacing U0=0, the equations (1) and (2) are simplified to:

$$0 \leq Uni < Ud - U_{Tn}(Uni) \quad (1a)$$

for the n-channel output transistors and to $$Ud \geq Upi > |U_{Tpo}| \quad (2a)$$

for the p-channel output transistors. The admissible potential ranges for Uni and Upi overlap each other according to the invention pursuant to (1a) and (2a) when the operating voltage Ud exceeds the sum of the threshold voltage values.

If the CMOS technology is realized with the aid of p-insulating islands in an n-conducting semiconductor body instead—as designed hitherto—with n-insulating islands in a p-conductor body, then substrate effects might possibly occur with the p-channel output transistors, while the n-channel output transistors which are then seated in p-insulating islands are spared from this.

I claim:

1. An integrated selection circuit for a number (N) of potentials (Ui ...), which is integrated in a complementary insulated-gate field-effect transistor technique (CMOS selection circuit), comprising:
    at least one transmission gate (G ...) assigned to each of the N potentials (U ...) whose switching section lies between the potential (U ...) and the output (U) of the selection circuit, at least one transmission gate further comprising two control inputs,
    the two control inputs of the respective transmission gate (G ...) being connected either directly or via a respectively associated inverter (I ...) to the corresponding output of a CMOS-1-ex-n-decoder.

2. A selection circuit as claimed in claim 1 wherein, said CMOS-1-ex-n-decoder comprises a 1-ex-n-open-circuit decoder (SD) and a 1-ex-n-short-circuit decoder (KD) whose address inputs are connected in pairs to one another and whose like outputs (1 ... 8) are connected to one another,
    said open-circuit decoder (SD) comprising transistors (TP) of the one channel conductivity type (p-channel in the drawings) which are arranged in an insulating island (NW) of the other channel conductivity type (n-channel in the drawings) within the semiconductor body of the integrated selection circuit, and
    said short-circuit decoder (KD) comprising transistors (TN) of the other channel conductivity type, which are arranged within the semiconductor body (HK).

3. A selection circuit as claimed in claim 2, wherein said 1-ex-n-open-circuit or short-circuit decoders are such ones for naturally binary encoded address signals.

4. A selection circuit as claimed in claims 1, 2 or 3, wherein only those partial transistors (P ..., N ...) of said transmission gates (G ...) and those of the inverters (I ...) associated with said partial transistors, are provided, with which the associated potential (U ...) is capable of being connected through to the output quicker and in a more low-ohmic manner.

5. A selection circuit as claimed in claim 4, for four potentials to be connected through (U0, U1, U2, U3) of which one (U0) is that of the zero point of the circuit, wherein,
    to the potential (U0) of the zero point of the circuit as connected through to the output, there belong the selecting signal state 00 and one partial transistor (N0) of the other channel conductivity type having its source and substrate connected thereto, with the gate thereof being connected via the associated inverter (I0) to the corresponding output of the 1-ex-4-binary decoder, and
    to the other three potentials (U1, U2, U3) there each time belongs one partial transistor (P1, P2, P3) of the one channel conductivity type with respectively one insulating island of its own, of the other channel conductivity type, which is connected to the associated source and to the associated potential (U1, U2, U3).

6. A selection circuit as claimed in claim 1, wherein one of said potentials is identical to the operating voltage (Ud) of said selection circuit.

7. A selection circuit as claimed in claim 5, wherein said transistor (P3) as associated with said operating voltage (Ud) is arranged in the insulating island (NW) of said open-circuit decoder (SD).

8. A selection circuit as claimed in claim 1, wherein the transistors of the one channel conductivity type as lying between the potentials to be selected (Uni) and the output (U), are each time arranged individually in their own respective insulating island of the other channel conductivity type.

9. A selection circuit as claimed in claim 2, wherein one of said potentials is identical to the operating voltage (Ud) of said selection circuit.

10. A selection circuit as claimed in claim 3, wherein one of said potentials is identical to the operating voltage (Ud) of said selection circuit.

11. A selection circuit as claimed in claim 4, wherein one of said potentials is identical to the operating voltage (Ud) of said selection circuit.

12. A selection circuit as claimed in claim 5, wherein one of said potentials is identical to the operating voltage (Ud) of said selection circuit.

13. A selection circuit as claimed in claim 9, wherein said transistor (P3) as associated with said operating voltage (Ud) is arranged in the insulating (NW) of said open-circuit decoder (SD).

14. A selection circuit as claimed in claim 10, wherein said transistor (P3) as associated with said operating voltage (Ud) is arranged in the insulating island (NW) of said open-circuit decoder (SD).

15. A selection circuit as claimed in claim 11, wherein said transistor (P3) as associated with said operating voltage (Ud) is arranged in the insulating island (NW) of said open-circuit decoder (SD).

16. A selection circuit as claimed in claim 12, wherein said transistor (P3) as associated with said operating voltage (Ud) is arranged in the insulating island (NW) of said open-circuit decoder (SD).

17. A selection circuit as claimed in claim 2, wherein the transistors of the one channel conductivity type as lying between the potentials to be selected (Uni) and the output (U), are each time arranged individually in their own respective insulating island of the other channel conductivity type.

18. A selection circuit as claimed in claim 3, wherein the transistors of the one channel conductivity type as lying between the potentials to be selected (Uni) and the output (U), are each time arranged individually in their own respective insulating island of the other channel conductivity type.

19. A selection circuit as claimed in claim 4, wherein the transistors of the one channel conductivity type as lying between the potentials to be selected (Uni) and the output (U), are each time arranged individually in their own respective insulating island of the other channel conductivity type.

20. A selection circuit as claimed in claim 5, wherein the transistors of the one channel conductivity type as lying between the potentials to be selected (Uni) and the output (U), are each time arranged individually in their own respective insulating island of the other channel conductivity type.

* * * * *